United States Patent
Kuo

(10) Patent No.: US 11,987,701 B2
(45) Date of Patent: May 21, 2024

(54) THERMOSETTING RESIN COMPOSITIONS, LIQUID PACKAGING MATERIAL, FILM, SEMICONDUCTOR PACKAGE, INTERLAYER INSULATING FILM, AND FLAME-RETARDANT RESIN COMPOSITION

(71) Applicant: CHIN YEE CHEMICAL INDUSTRIES CO., LTD., Taipei (TW)

(72) Inventor: Pi-Tao Kuo, Taipei (TW)

(73) Assignee: CHIN YEE CHEMICAL INDUSTRIES CO., LTD., Taipei (TW)

( * ) Notice: Subject to any disclaimer, the term of this patent is extended or adjusted under 35 U.S.C. 154(b) by 474 days.

(21) Appl. No.: 17/243,536

(22) Filed: Apr. 28, 2021

(65) Prior Publication Data

US 2021/0269641 A1 Sep. 2, 2021

(30) Foreign Application Priority Data

Mar. 15, 2021 (TW) ................................ 110109137

(51) Int. Cl.
| | |
|---|---|
| *C08L 79/04* | (2006.01) |
| *C08K 5/3415* | (2006.01) |
| *C08K 5/5397* | (2006.01) |
| *H01L 23/29* | (2006.01) |

(52) U.S. Cl.
CPC ............ *C08L 79/04* (2013.01); *C08K 5/3415* (2013.01); *C08K 5/5397* (2013.01); *H01L 23/293* (2013.01); *C08L 2201/02* (2013.01); *C08L 2203/206* (2013.01)

(58) Field of Classification Search
CPC ..... C08G 73/0233; C08L 79/00; C08L 79/04; C08L 79/085
See application file for complete search history.

(56) References Cited

U.S. PATENT DOCUMENTS

2018/0208765 A1 7/2018 Liu et al.

FOREIGN PATENT DOCUMENTS

| | | |
|---|---|---|
| JP | 4570419 | 10/2010 |
| JP | 2018135429 | 8/2018 |
| JP | 2020122161 | 8/2020 |
| TW | I429639 | 3/2014 |
| TW | I471358 | 2/2015 |
| TW | 201840650 | 11/2018 |
| TW | 202020022 | 6/2020 |
| TW | 202108665 | 3/2021 |
| TW | 202108697 | 3/2021 |
| WO | 2017002319 | 1/2017 |
| WO | 2018198992 | 11/2018 |
| WO | 2019078300 | 4/2019 |
| WO | 2019138919 | 7/2019 |
| WO | 2019189467 | 10/2019 |
| WO | WO 2019/189466 A1 * | 10/2019 |
| WO | 2020054218 | 3/2020 |

OTHER PUBLICATIONS

WO 2019/189466 A1 machine translation (Oct. 2019).*
"Office Action of Taiwan Counterpart Application", issued on Aug. 18, 2021, p. 1-p. 6.
"Office Action of Japan Counterpart Application", issued on Apr. 12, 2022, p. 1-p. 3.

* cited by examiner

*Primary Examiner* — Ana L. Woodward
(74) *Attorney, Agent, or Firm* — JCIPRNET

(57) ABSTRACT

The disclosure provides a thermosetting resin composition which contains at least: (a) a benzoxazine resin and (b) bismaleimide. The disclosure provides a flame-retardant resin composition which contains at least: (a) a benzoxazine resin, (b) bismaleimide, and (c) a flame retardant. The thermosetting resin composition and the flame-retardant resin composition may be used as a constituent element of a semiconductor liquid packaging material, or an interlayer insulating film.

12 Claims, 2 Drawing Sheets

THERMOSETTING RESIN COMPOSITIONS, LIQUID PACKAGING MATERIAL, FILM, SEMICONDUCTOR PACKAGE, INTERLAYER INSULATING FILM, AND FLAME-RETARDANT RESIN COMPOSITION

CROSS-REFERENCE TO RELATED APPLICATION

This application claims the priority benefit of Taiwan application serial no. 110109137, filed on Mar. 15, 2021. The entirety of the above-mentioned patent application is hereby incorporated by reference herein and made a part of this specification.

BACKGROUND

Technical Field

The disclosure discloses a thermosetting resin composition, the composition at least contains: (a) a benzoxazine resin and (b) bismaleimide. The disclosure discloses a flame-retardant resin composition, the composition at least contains: (a) a benzoxazine resin, (b) bismaleimide, and (c) a flame retardant. The thermosetting resin composition and the flame-retardant resin composition can be used as constituent elements of semiconductor liquid packaging materials and interlayer insulating films.

Description of Related Art

As the 5G communication era has dawned and with the rapid innovation of semiconductor-related materials, SiC and GaN wide-bandgap semiconductors have been developed to replace conventional Si as power semiconductors of the next generation. In semiconductor packaging, in order to shorten the length of wire, the industry is actively developing and applying new-generation of packaging such as Fan-Out Wafer Level Packaging (FOWLP) that connects components with a short distance. The development of packaging materials and rewiring materials having low dielectric properties has come along. FOWLP does not require an integrated circuit (IC) carrier board, making the overall semiconductor package to be thinner. Therefore, Apple Inc. in the United States adopted FOWLP technology in iPhone 7.

In recent years, electronic modules used in automobiles have attracted people's attention. For example, the rapid development of electric vehicles, autonomous driving, and automobile electronic technologies have also promoted the continuous growth of the semiconductor industry. Automotive electronic modules include Electronic Control Unit (ECU), Power Control Unit and Advanced Driving Support System (ADAS).

The ADAS system is an important foundation for autonomous driving, the most important of which is the use of various sensors to collect data inside and outside the vehicle. Sensors include millimeter wave radar, ultrasonic radar, infrared radar, laser radar, CCD/CMOS image sensor and wheel speed sensor. Specifically, millimeter wave radar is a key component of ADAS. The applications of FOWLP that have attracted much attention in the high-frequency field include millimeter wave radar and antenna packaging.

There are two frequently used frequency bands for millimeter wave radar, 24 GHz and 77 GHz/79 GHz. The 24 GHz sensor radar is mainly used in short-range and medium-range detection applications, such as blind spot detection, pedestrian detection, and parking assistance. On the other hand, the 77 GHz/79 GHz sensor radar has a longer detection range, and therefore can be used for cruise control and collision warning. These sensor radars are adopted in the form of Monolithic microwave integrated circuit (MMIC). For the MMIC package of the millimeter wave radar, as the dielectric loss (Df) of the liquid packaging material increases, the signal waveform becomes passivated. Therefore, the dielectric loss (Df) of the liquid packaging material is the main cause of signal transmission loss and the key to the safety of autonomous driving. The semiconductor liquid packaging materials used in millimeter wave radars are required to have unprecedented high characteristics and high reliability. Especially for the hermetic seal of the feedthrough part where the signal enters and exits, it is not easy to manufacture the hermetic seal with good characteristics in the millimeter wave field.

Between the chip and the substrate, the circuit is connected by a lead and tape automated bonding (TAB) method, and the surface of the chip and the joint are coated with a liquid packaging material. When the flip chip is connected, liquid sealing is performed in the gap between the chip and the substrate, and the liquid packaging material is referred to as underfill material to protect and reinforce the bonding part. In the high-speed and high-frequency communication field, when the signal is transmitted at the metal joint, the influence of the dielectric loss of the liquid packaging material used for metal insulation on the signal transmission loss should be taken into consideration.

In Patent Literature 1 to 4, conventional liquid packaging materials adopt epoxy resin and curing agent as the main material. The disadvantage is that after the epoxy resin is cured, it will produce water-absorbing hydroxyl groups (OH groups), which will significantly increase the dielectric loss and therefore is unsuitable for high-speed and high-frequency communication field.

Patent Literature 5 adopts benzoxazine resin and cyanate ester resin as the main components, the curing temperature of the above materials is about 280~300° C. under the circumstances that no curing acceleration is applied. Additionally, the cyanate ester resin cured product has a high water absorption, and therefore the dielectric properties Dk=3.6 and Df=0.009 also become higher, which is not suitable for advanced semiconductor packaging.

The curing temperature of the aliphatic bone benzoxazine resin of Patent Literature 6 is about 250 to 270° C., and the curing temperature of the aliphatic bone bismaleimide of Patent Literature 7 is about 290 to 300° C., which is not advantageous for the reliability of semiconductor packaging.

PATENT LITERATURE

Patent Literature 1: JP2020122161A
Patent Literature 2 JPWO2019138919A1
Patent Literature 3 JPWO2018198992A1
Patent Literature 4 JP2018135429A
Patent Literature 5 JP4570419B
Patent Literature 6 TWI471358B
Patent Literature 7 TWI429639

SUMMARY

The problem to be solved by the disclosure is that the current liquid packaging materials for semiconductors are still dominated by liquid epoxy resin due to reliability and thermal expansion factors. However, the epoxy resin will produce water-absorbing OH groups after curing. The presence of such polar groups increases the dielectric constant and dielectric loss of the material, and is not suitable for packaging high-frequency components. In addition, the epoxy resin is not suitable for application in millimeter wave radar sensors due to water absorption. Especially for automotive millimeter wave radar sensors which have high requirement for the safety of people and vehicles, inorganic fillers account for about 50% or less in the liquid packaging materials, it is difficult to achieve flame retardancy through a large amount of fillers. It is difficult for such liquid packaging materials to have both flame retardancy and low-dielectric characteristics both. The power consumption of future high-frequency components will continue to increase, and the internal heat of the components will also increase. How to solve the heat resistance and flame retardancy issues for liquid packaging materials has drawn a lot of attention. In terms of thinning of packaging materials, although it is possible to suppress warpage through low Tg and low elastic modulus designs, how to improve the toughness of the cured resin after the thickness of the sealing material is reduced has also become a problem to be solved.

In view of the above problems, the technical means of the disclosure to solve the problem is to provide a new type of liquid packaging material, the material is mainly benzoxazine-modified bismaleimide heat-resistant resin, which has low dielectric properties, low Tg, low elasticity modulus, high heat resistance, high toughness and other characteristics, thus being suitable to be adopted as a semiconductor packaging material in the high-frequency field.

An embodiment of the disclosure provides a thermosetting resin composition, the composition at least containing:

(a) a benzoxazine resin, which includes:
at least one selected from a group consisting of

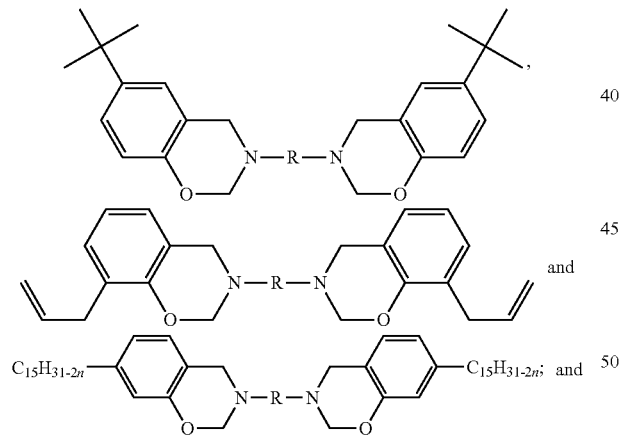

(b) bismaleimide, its chemical structure is shown in formula (1):

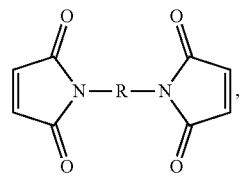

formula (1)

wherein R is a C36 divalent hydrocarbon group with an aliphatic side chain; n is an integer selected from 0 to 3; the equivalent ratio of the benzoxazine resin:bismaleimide=0.1 to 0.5:1.0.

Another embodiment of the disclosure provides a flame-retardant resin composition, the composition at least contains:

(a) a benzoxazine resin, which includes:
at least one selected from a group consisting of

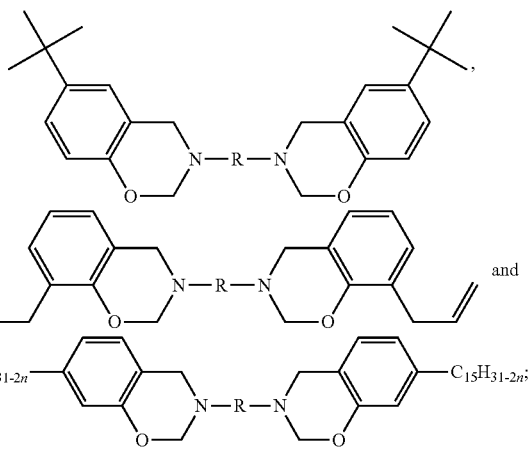

(b) bismaleimide, its chemical structure is shown in formula (1):

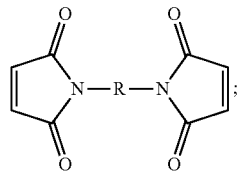

formula (1)

and
(c) a flame retardant, its chemical structure is shown in formula (2):

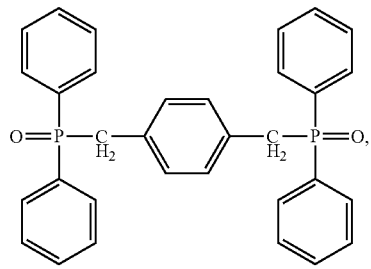

formula (2)

wherein R is a C36 divalent hydrocarbon group with an aliphatic side chain; n is an integer selected from 0 to 3; the equivalent ratio of the benzoxazine resin:bismaleimide=0.1 to 0.5:1.0.

The disclosure discloses a benzoxazine-modified bismaleimide of a thermosetting resin composition, which is a mixture of benzoxazine containing long aliphatic chain bone and bismaleimide containing long aliphatic chain bone with an equivalent ratio of 0.3:1, and also has a low-temperature reaction behavior. Moreover, the equivalent ratio of 0.3:1 is adopted as the base to determine that the benzoxazine-modified bismaleimide has better dielectric properties, heat resistance and mechanical properties than the benzoxazine containing long aliphatic chain bone and bismaleimide containing long aliphatic chain bone.

Automotive electronic modules are often exposed to extreme environmental conditions such as high temperature and high humidity. Therefore, in automotive electronic modules, insulating polymers of semiconductor packaging materials are required to have low dielectric properties and heat resistance. The dielectric properties and heat resistance properties of the flame retardant added to the packaging material must also be taken into consideration. BPO phosphorous-based flame retardant (the above-mentioned (c) flame retardant) is characterized in high thermal decomposition temperature Td3=359° C., high melting point mp=336° C., high refractive index n=1.700 and so on, and its molecular crystallinity is higher than ordinary phosphorus flame retardant. Since the crystallinity of BPO phosphorous-based flame retardant inhibits molecular movement, it is possible to reduce dielectric loss. By adding the BPO phosphorus-based flame retardant to the benzoxazine-modified bismaleimide resin respectively, it is possible to improve the dielectric properties, heat resistance and mechanical properties.

In contrast to the efficacy of the conventional technology, the disclosure discloses benzoxazine-modified bismaleimide in a thermosetting resin composition, the benzoxazine-modified bismaleimide has better low dielectric properties than conventional epoxy resin, benzoxazine resin, and bismaleimide.

For the benzoxazine-modified bismaleimide disclosed in the disclosure, when a long aliphatic chain is introduced into benzoxazine or bismaleimide, the viscosity will decrease and the toughness will increase. Since the polar imine group is diluted, the relative dielectric constant and dielectric loss can be effectively reduced. The bismaleimide reacts with the phenolic hydroxyl group of the benzoxazine to form an ether bond, which can remove and reduce the phenolic hydroxyl group of the benzoxazine. In the meanwhile, it can also serve cross-linking and bridging functions to improve physical properties and reduce relative dielectric constant and dielectric loss. In addition, the curing temperature of benzoxazine-modified bismaleimide is also lower than the curing temperature of benzoxazine and bismaleimide. Liquid benzoxazine-modified bismaleimide resin can be obtained with low dielectric properties, high heat resistance, high toughness, low storage modulus and other characteristics. By adding BPO phosphorus-based flame retardant, it is possible to further reduce dielectric loss, improve heat resistance and achieve flame retardancy. Additionally, in consideration of environmental compatibility, biomass raw materials and phosphorus-based flame retardants are adopted, they are suitable for being applied as liquid packaging materials and interlayer insulating films in the high-speed and high-frequency communication fields.

DESCRIPTION OF THE EMBODIMENTS

Embodiments of the disclosure provide a thermosetting resin composition, the composition at least containing:
(a) a benzoxazine resin, which includes:
at least one selected from a group consisting of

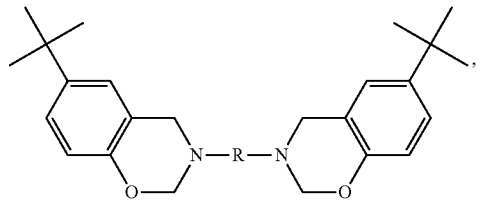

(referred to as "TPda" hereafter),

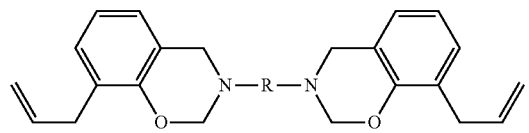

(referred to as "APda" hereafter) and

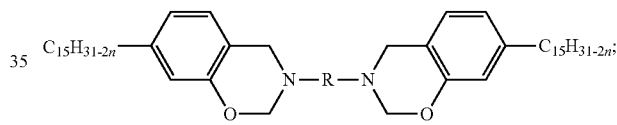

(referred to as "CPda" hereafter); and
(b) bismaleimide, its chemical structure is shown in formula (1):

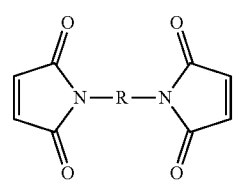

formula (1)

(referred to as "B36" hereafter),
wherein R is a divalent hydrocarbon group having a carbon number of 36 (referred to as "C36" hereafter) with aliphatic side chain; n is an integer selected from 0 to 3; the equivalent ratio of benzoxazine resin:bismaleimide=0.1 to 0.5:1.0.

The disclosure provides a thermosetting resin composition, wherein R is a C36 divalent hydrocarbon group with aliphatic side chain, and the C36 divalent hydrocarbon diamine (abbreviation: C36DA) with aliphatic side chain used in the benzoxazine resin and bismaleimide is a product obtained from plant-derived dimers containing unsaturated C18 aliphatic acids after reductive amination. The known structure of C36 divalent hydrocarbon diamine with aliphatic side chain includes:

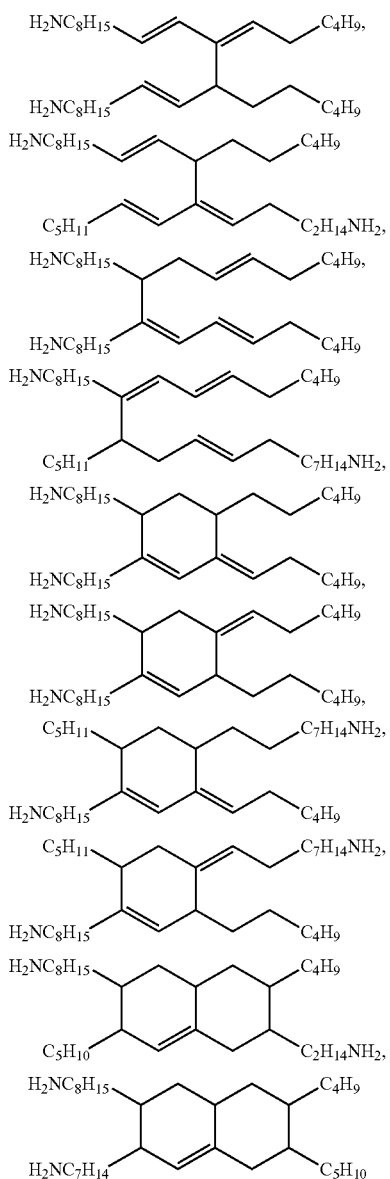

and so on.

The disclosure provides a thermosetting resin composition, wherein the phenols used include: butyl phenol, allyl phenol, cardanol, C1~C18 hydrocarbyl phenol, or a combination thereof, in which cardanol derived from plant is mainly composed of three kinds of phenols, and their chemical structures and composition ratio are as follows:

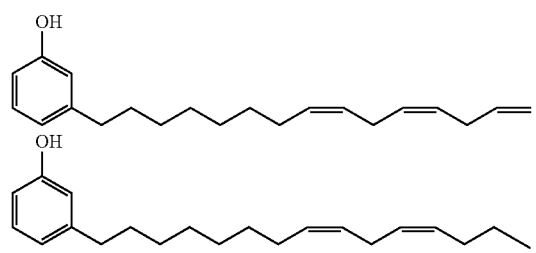

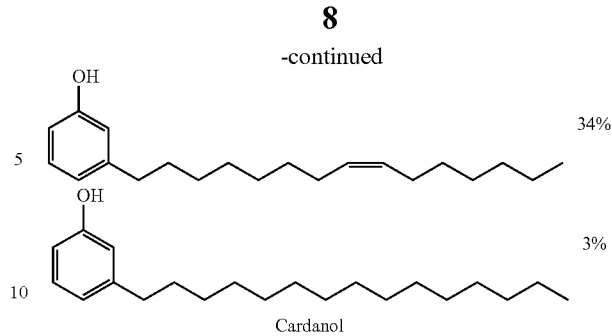

Cardanol

The disclosure provides a thermosetting resin composition, which is a bismaleimide resin modified with benzoxazine. Generally, the hydroxyl group produced by the thermal ring-opening polymerization of benzoxazine reacts with the double bond to form an ether structure, the thermal ring-opening reaction of benzoxazine will form an ion pair of phenoxy anion and imine cation. Specifically, phenoxy anion has strong nucleophilicity, and phenoxy anion may also attack electron-deficient double bonds, and play a catalytic role in the reaction of benzoxazine and bismaleimide, as shown in the following ring opening and anionic polymerization.

[Reaction of Polybenzoxazine with Double Bond of Bismaleimide]

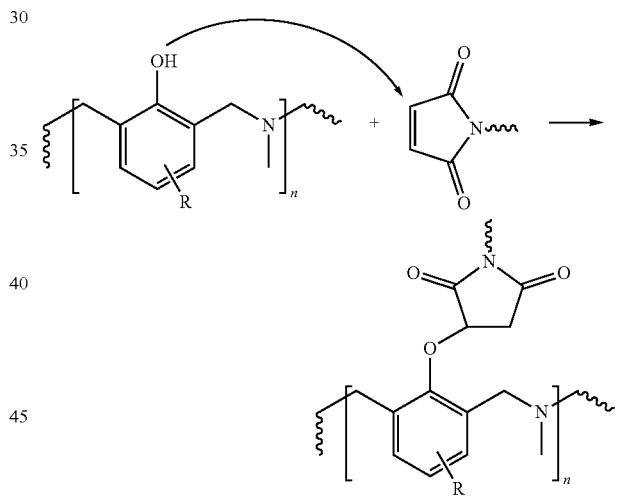

[Reaction of the Double Bond of Bismaleimide with Nucleophilic Component (Bismaleimide Anionic Polymerization)]

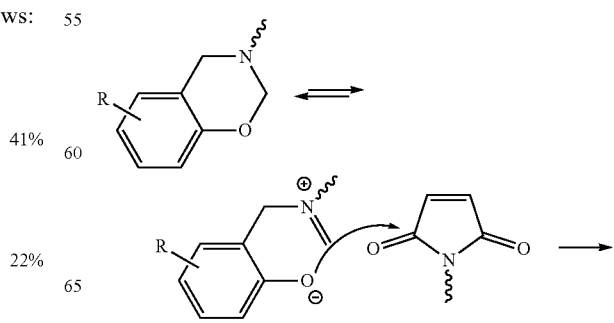

-continued

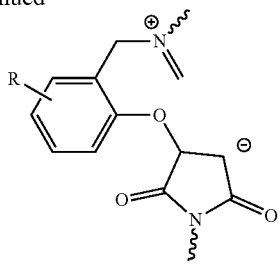

Figure 1:
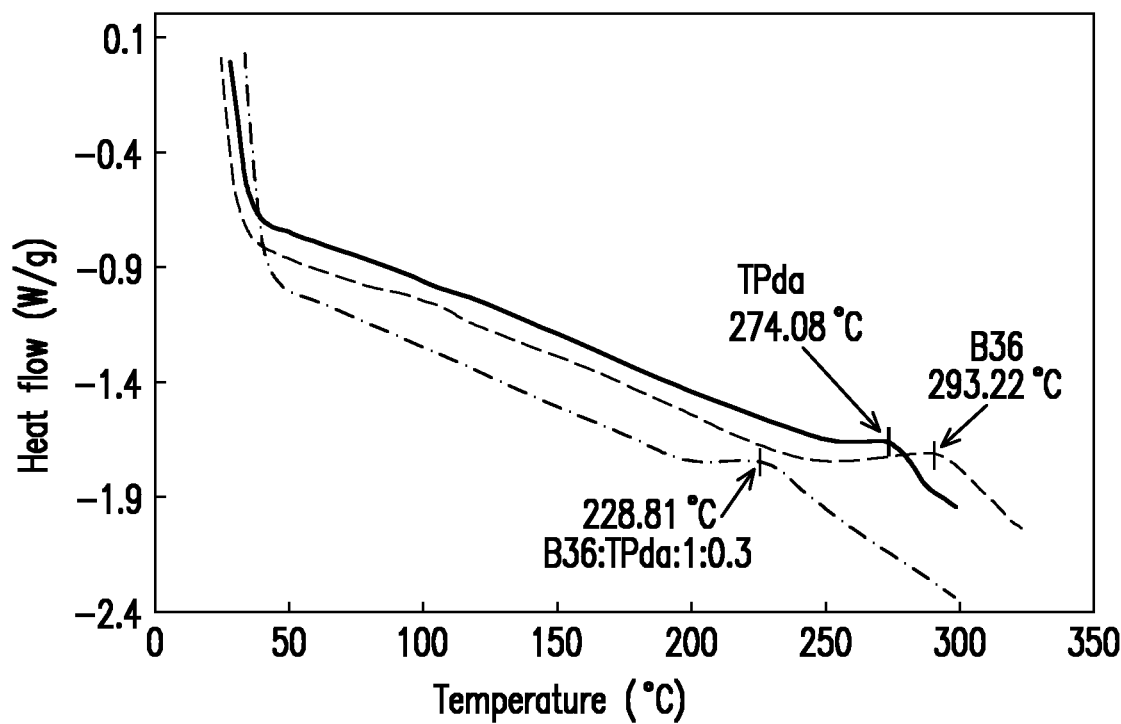
FIG. 1 is a differential scanning calorimetry (DSC) analysis diagram of a cured product of benzoxazine and bismaleimide according to the first embodiment of the disclosure.

The present disclosure provides a thermosetting resin composition, which is a bismaleimide resin modified with benzoxazine. FIG. 1 is a differential scanning calorimetry (DSC) analysis diagram of a cured product of benzoxazine and bismaleimide according to the first embodiment of the disclosure (corresponding to Example 6 described later). In FIG. 1, the curve of bismaleimide B36 is a dashed line, and the curve of benzoxazine TPda is a solid line. The curve is a dot-dash broken line when the equivalent ratio of bismaleimide B36 to benzoxazine TPda is 1.0:0.3. In addition, in FIG. 1, since benzoxazine TPda and bismaleimide B36 catalyze each other during the thermal curing process, when the equivalent ratio of bismaleimide B36 to benzoxazine TPda is =1.0:0.3, the original exothermic peak 293.22° C. of the bismaleimide B36 and the exothermic peak 274.08° C. of benzoxazine TPda disappear, and a new exothermic peak 228.81° C. occurs at a low temperature.

Figure 2:
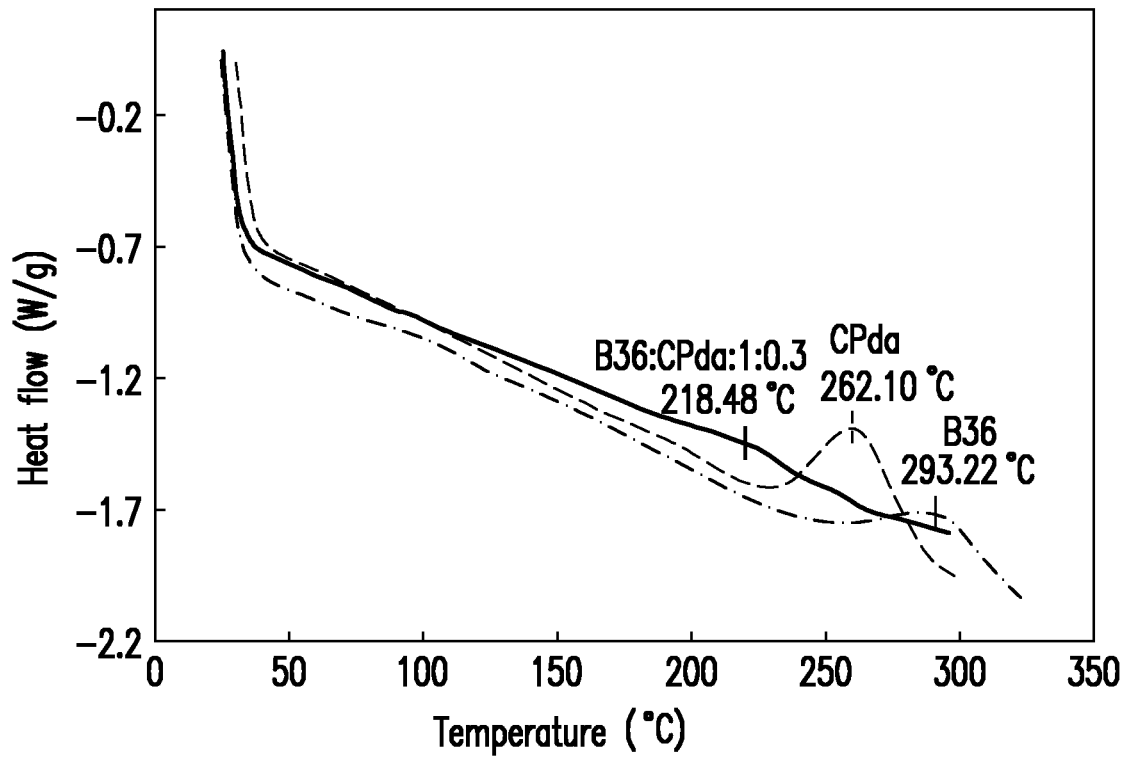
FIG. 2 is a DSC analysis diagram of a cured product of benzoxazine and bismaleimide according to a second embodiment of the disclosure.

FIG. 2 is a DSC analysis diagram of a cured product of benzoxazine and bismaleimide according to a second embodiment of the disclosure (corresponding to Example 9 described later). In FIG. 2, the curve of bismaleimide B36 is a dot-dash broken line, the curve of benzoxazine CPda is a dashed line, and the curve is a solid line when the equivalent ratio of bismaleimide B36 to benzoxazine CPda=1.0:0.3. In addition, in FIG. 2, for the same reason as in the first embodiment, when the equivalent ratio of bismaleimide B36 to benzoxazine CPda is =1.0:0.3, the original exothermic peak 293.22° C. of the bismaleimide B36 and the exothermic peak 262.10° C. of benzoxazine CPda disappear, and a new exothermic peak 218.48° C. occurs at a low temperature.

Figure 3:
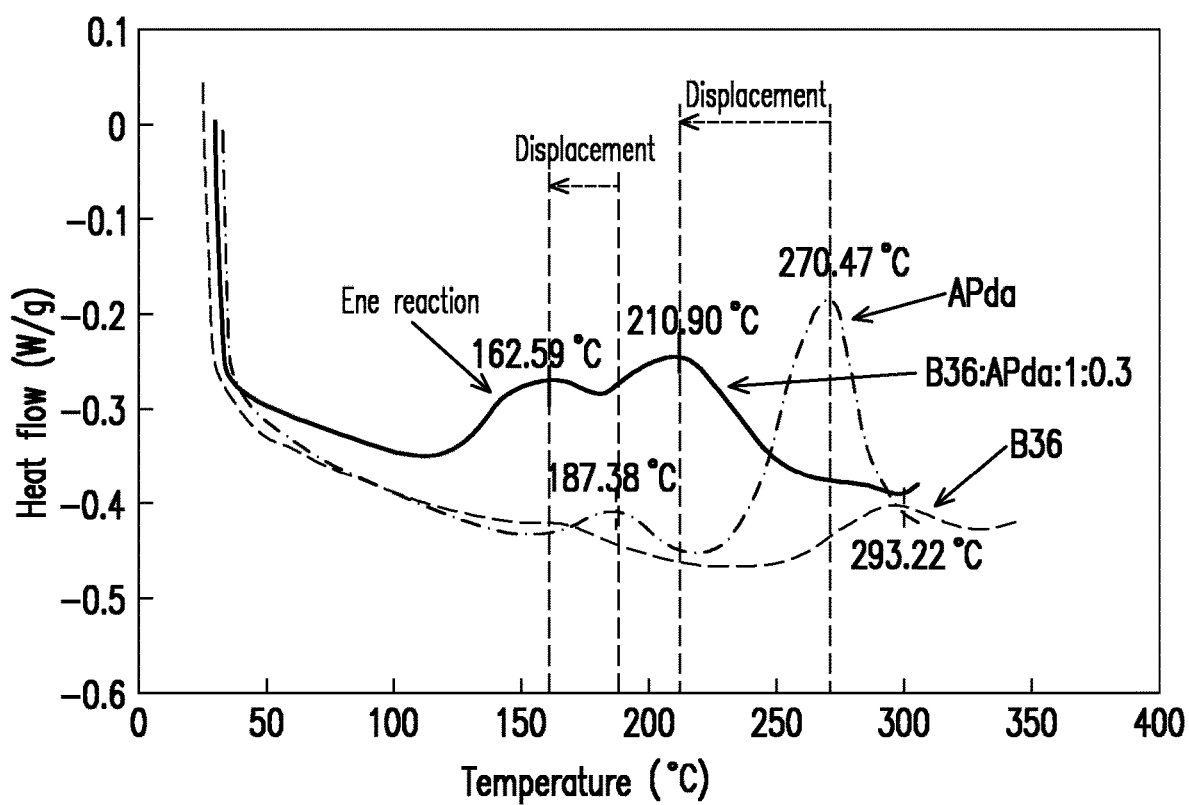
FIG. 3 is a DSC analysis diagram of a cured product of benzoxazine and bismaleimide according to a third embodiment of the disclosure.

FIG. 3 is a DSC analysis diagram of a cured product of benzoxazine and bismaleimide according to a third embodiment of the disclosure (corresponding to Example 12 described later). In FIG. 3, the curve of bismaleimide B36 is a dashed line, and the curve of benzoxazine APda is a dot-dash broken line, the curve of is a solid line when the equivalent ratio of bismaleimide B36 to benzoxazine APda is 1.0:0.3. In addition, in FIG. 3, for the same reason as in the first embodiment, when the equivalent ratio of bismaleimide B36 to benzoxazine APda=1.0:0.3, the original exothermic peak 293° C. of bismaleimide B36 and the exothermic peak 270° C./187° C. of benzoxazine APda disappear, and a new exothermic peak 210° C./162° C. occurs at a low temperature. It can be seen from FIG. 3 that at about 210° C., benzoxazine and bismaleimide fully interact with each other. At 162.59° C., allyl and bismaleimide are bonded with each other through ene reaction, and curing at a low temperature is advantageous for semiconductor packaging reliability. Moreover, the mixture of bismaleimide B36 and benzoxazine Apda has a two-step curing performance, that is, it is B-stage pre-curing when cured at 162.59° C., and it is C-stage complete curing when cured at 210.90° C. In this way, the glueability in the film manufacturing process can be reduced, and caulking during lamination can be increased. The two-stage curing characteristics are very suitable for the manufacture of interlayer insulating films.

The disclosure provides a thermosetting resin composition, which is a bismaleimide resin modified with benzoxazine, using a plant-derived C36 divalent hydrocarbon diamine with aliphatic side chain as a raw material for synthesizing benzoxazine and bismaleimide. Liquid TPda, CPda, APda and B36 resins can be obtained, which can be applied to liquid packaging materials that require fluidity. The cured product of benzoxazine-modified bismaleimide is obtained after blending of benzoxazine and bismaleimide. Because the ether bond strengthens the strength and toughness, it is possible to make the co-cured product become strong and tough, and the co-cured product is suitable for being applied to thin-layer packaging materials that require strength and toughness.

The disclosure provides a thermosetting resin composition, which is a benzoxazine-modified bismaleimide resin, which uses a plant-derived C36 divalent hydrocarbon diamine with aliphatic side chain as a raw material for synthesizing benzoxazine and bismaleimide. Due to the large molecular weight of C36 divalent hydrocarbon diamines with aliphatic side chain, C36 aliphatic chain with low polarity can dilute the concentration of polar iminium groups. In addition, the combination of the phenol group and the bismaleimide into an ether bond after the ring opening of the benzoxazine greatly reduces the water absorption, so the dielectric loss can be effectively reduced. In addition, the introduction of amide groups in the resin can solve the shortcomings of insufficient heat resistance of C36 aliphatic chain. In terms of Tg and elastic modulus, the introduction of C36 aliphatic chain greatly reduces the warpage caused by the mismatched thermal expansion between the chip and the substrate. In this way, through the design of low Tg and low elasticity modulus, the internal stress of the benzoxazine-modified bismaleimide resin can be alleviated, and the warpage phenomenon can be suppressed.

The disclosure provides a thermosetting resin composition at least containing: (a) benzoxazine resin and (b) bismaleimide, wherein (equivalent ratio) of benzoxazine resin:bismaleimide=0.1~0.5:1.0, preferably (equivalent ratio) of benzoxazine resin:bismaleimide=0.15~0.4:1.0, more preferably (equivalent ratio) of benzoxazine resin:bismaleimide=0.25~0.3:1.0.

The disclosure provides a thermosetting resin composition, which is a benzoxazine-modified bismaleimide resin. In addition to the thermal free radical polymerization of bismaleimide, its nucleophilic attack can also cause anionic polymerization, which helps improve reactivity. The interaction between bismaleimide and benzoxazine improves the curability of bismaleimide. The system has excellent physical and chemical properties such as high heat resistance and low dielectric properties.

Another embodiment of the disclosure provides a flame-retardant resin composition, the composition at least contains:

(a) a benzoxazine resin, which includes:
at least one selected from a group consisting of

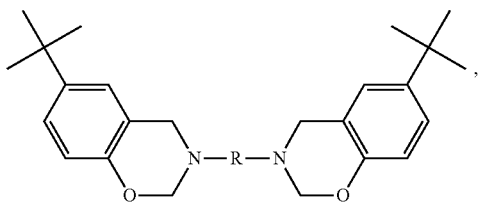

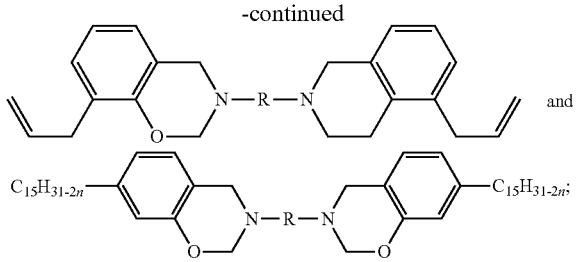

(b) bismaleimide, its chemical structure is shown in formula (1):

formula (1)

and (C) a flame retardant, its chemical structure is shown in formula (2):

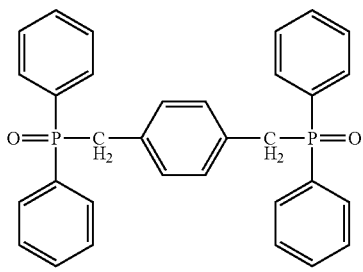

formula (2)

(Paraxylylene bisdiphenylphosphine oxide (BPO)) wherein R is a C36 divalent hydrocarbon group with an aliphatic side chain; n is an integer selected from 0 to 3; the equivalent ratio of the benzoxazine resin:bismaleimide=0.1 to 0.5:1.0.

The disclosure provides a flame-retardant resin composition that can be used in automotive electronic modules. The automotive electronic modules have to be exposed to extreme environments such as high temperature and high humidity for a long time. The insulating polymer used as semiconductor packaging material in automotive electronic modules is required to have low dielectric properties and high heat resistance. Likewise, the flame retardant added to the packaging material must also have low dielectric properties and high heat resistance properties.

The disclosure provides a flame-retardant resin composition, wherein the BPO flame retardant (i.e., the compound represented by formula (2)) has a high thermal decomposition temperature Td3=359° C., melting point mp=336° C., and refractive index n=1.700. The crystallinity of molecules of BPO flame retardant is higher than that of ordinary phosphorus flame retardants. Since the crystallinity of BPO flame retardant inhibits the movement of molecules, it is possible to reduce dielectric loss. The BPO flame retardant is added to the benzoxazine-modified bismaleimide resin, and the BPO molecular structure has high symmetry, and the dipole moment of the molecule is small, so it is possible to effectively inhibit the increase of c dielectric constant and the dielectric loss, thereby enhancing the mechanical properties.

The disclosure provides a flame-retardant resin composition, wherein the particle size of the BPO flame retardant is 10 nm to 5 preferably 100 nm to 1 When the BPO flame retardant is added to the benzoxazine-modified bismaleimide resin, the more the BPO flame retardant is added, the lower the thermal expansion of the cured product of resin. The larger the particle size, the lower the thermal expansion of the cured product of resin.

The disclosure provides a flame-retardant resin composition, which is a benzoxazine-modified bismaleimide resin, and BPO flame retardant is added to the benzoxazine-modified bismaleimide resin, so as to impart flame retardancy to the cured resin, improve the heat resistance of the cured resin, and reduce the dielectric positive connection and thermal expansion coefficient. In the meanwhile, flame retardancy and low dielectric properties can be retained, and therefore the flame-retardant resin composition of the disclosure is suitable for being used as a liquid packaging material in the high-frequency communication field.

The disclosure provides a liquid packaging material, which contains a thermosetting resin composition or a flame-retardant resin composition as its constituent elements. The disclosure provides a film containing a thermosetting resin composition or a flame-retardant resin composition as its constituent elements. The disclosure provides a liquid packaging material, which is used for manufacturing semiconductor packages. The disclosure provides a film, which is used for manufacturing semiconductor packages or interlayer insulating films.

Hereinafter, the disclosure will be described in detail with reference to examples. The following examples are provided to describe the disclosure, and the scope of the disclosure includes the scope described in claims and their substitutions and modifications, and is not limited to the scope of the examples.

Example 1

0.10 mol of C36 divalent hydrocarbon diamine with aliphatic side chain (abbreviation: C36DA, brand name: Priamine 1074, manufactured by Croda Japan Co., Ltd., amine value: 205), 150 grams of toluene and 100 grams of isobutanol were added to a 4-port reaction flask equipped with a stirrer, a condenser, a distillation receiver, a nitrogen tube and an isobaric dropping funnel. 0.40 mol of 37% formaldehyde was dropped into the reaction flask, and the temperature was controlled at a temperature of 20 to 30° C., and the reaction was continued for 5 hours. Then 0.20 mol of p-tert-butylphenol (PTBP) was added and heated to 90 to 120° C. to azeotropically remove the generated water, and then the solvent was removed through distillation under reduced pressure to obtain benzoxazine TPda. High pressure liquid chromatography (HPLC) showed that the residual amount of C36DA was 0.030%, and the residual amount of PTBP was 0.022% or less.

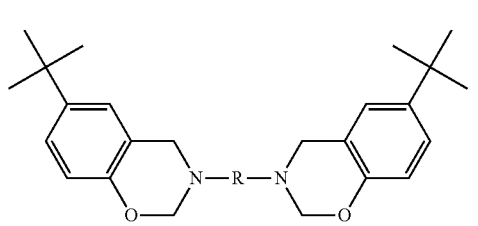

TPda

R is a C36 divalent hydrocarbon group with aliphatic side chain.

Example 2

0.10 mol of C36DA (Priamine 1074, manufactured by Croda, with an amine value of 205), 200 grams of toluene and 100 grams of isobutanol were added to the 4-port reaction flask equipped with a stirrer, a condenser, a distillation receiver, a nitrogen tube and an isobaric dropping funnel. After dropping 0.40 mol of 37% formaldehyde into the reaction flask and reacting at a temperature of 20 to 30° C. for 5 hours, 0.20 mol of cardanol (brand name NX-2026, manufactured by Cardolite, purity is 99.2%, referred to as "CP") was added, and the temperature was heated to 90 to 120° C. to azeotropically remove the generated water, and then the solvent is removed by distillation under reduced pressure to obtain the benzoxazine CPda. Analyzed by HPLC, the residual amount of C36DA was 0.026%, and the residual amount of CP was 0.020% or less.

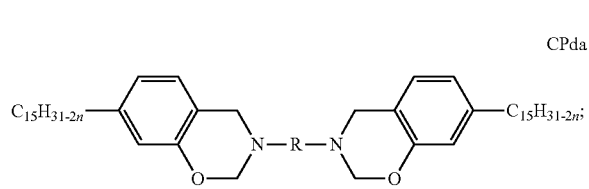

CPda wherein R is a C36 divalent hydrocarbon group with an aliphatic side chain, and n is an integer selected from 0 to 3.

Example 3

0.10 mol of C36DA (Priamine 1074, manufactured by Croda, with an amine value of 205), 150 grams of toluene and 100 grams of isobutanol were added to the 4-port reaction flask equipped with a stirrer, a condenser, a distillation receiver, a nitrogen tube and an isobaric dropping funnel. 0.40 mol of 37% formaldehyde was dropped into the reaction flask, the temperature was controlled at 20 to 30° C., and the reaction was continued for 5 hours. Then 0.20 mol of 2-allylphenol (Sigma-Aldrich, purity 99.%, abbreviated as "AP") was added, and the temperature was heated to 90 to 120° C. to azeotropically remove the generated water, and then the solvent is removed by distillation under reduced pressure to obtain the benzoxazine APda. Analyzed by HPLC, the residual amount of C36DA was 0.030%, and the residual amount of AP was 0.022% or less.

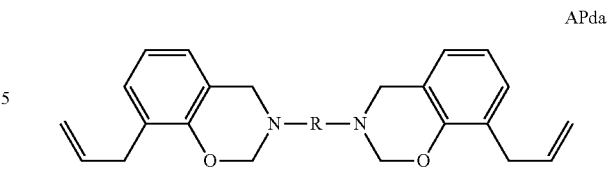

APda

R is a C36 divalent hydrocarbon group with aliphatic side chain.

Example 4

0.2 mole of maleic anhydride, 150 g of xylene, 30 g of dimethylformamide, 0.06 g of copper sulfate and 0.3 g of p-methoxyphenol were added to the 4-port reaction flask equipped with a stirrer, a condenser, a distillation receiver, a nitrogen tube and an isobaric dropping funnel. An ice bath is carried out to lower the reaction temperature to 5 to 10° C. 0.099 mol of C36DA was added in small amounts for several times, the reaction was continued for 1 hour, then 1 g of sulfuric acid was added, the temperature was heated to 120 to 150° C., and refluxed to azeotropically remove water. The temperature was cooled to room temperature and the bottom catalyst layer was separated and removed to obtain bismaleimide solution. The bismaleimide solution was washed twice with water to remove dimethylformamide, then washed twice with 1% sodium carbonate aqueous solution, washed three times with distilled water, and the solvent was removed by distillation under reduced pressure at 100° C. to obtain bismaleimide B36. The yield rate was 80%, and the purity by HPLC analysis was 99.5%.

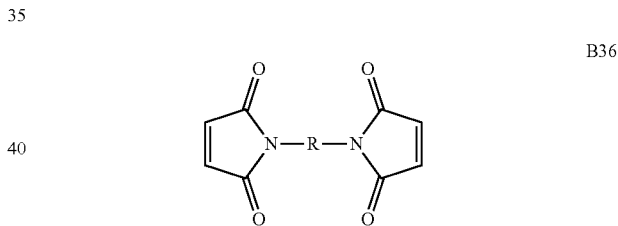

B36

R is a C36 divalent hydrocarbon group with aliphatic side chain.

Examples 5 to 13

According to Table 1, Examples 5 to 13 were conducted based on the following equivalent ratios of benzoxazine resin (benzoxazine TPda in Example 1, benzoxazine CPda in Example 2, and benzoxazine Apda in Example 3) to bismaleimide B36 (B36 of Example 4):
TPda:B36=0.15:1.0 (Example 5)
TPda:B36=0.30:1.0 (Example 6)
TPda:B36=0.50:1.0 (Example 7)
CPda:B36=0.15:1.0 (Example 8)
CPda:B36=0.30:1.0 (Example 9)
CPda:B36=0.50:1.0 (Example 10)
APda:B36=0.15:1.0 (Example 11)
APda:B36=0.30:1.0 (Example 12)
APda:B36=0.50:1.0 (Example 13)

After mixing the above examples uniformly, an adhesive solution was produced, dried at 170° C. for 2 hours, dried at 200° C. for 2 hours, and finally baked at 220° C. for 2 hours to form a cured product with a film thickness of 1.0 mm.

Then dielectric constant (Dk) and dielectric loss (Df) of the cured product were measured. In addition, the glass transition temperature, elastic modulus (also called "elasticity modulus"), thermal decomposition temperature, strain, maximum stress, toughness and water absorption of the cured product in Example 7, Example 10, and Example 12 were measured. Please see Table 1 and Table 2 for detailed measurement results.

Comparative Example 1

30 g of bismaleimide (B36 of Example 4) and 0.05 g of dicumyl peroxide were mixed uniformly to produce an adhesive solution, which was dried at 180° C. for 2 hours, and dried at 210° C. for 2 hours, and finally baked at 220° C. for 2 hours to make a cured product with a film thickness of 1.0 mm. Then, dielectric constant (Dk), dielectric loss (Df), glass transition temperature, elastic modulus, thermal decomposition temperature, strain, maximum stress, toughness and water absorption of the cured product were measured. Please see Table 1 and Table 2 for detailed measurement results.

Comparative Examples 2 to 4

According to Table 1, Comparative Examples 2 to 4 are the adhesive solution of benzoxazine resin (TPda in Example 1, CPda in Example 2, and Apda in Example 3), which were dried at 180° C. for 2 hours, and dried at 210° C. for 2 hours, and finally baked at 250° C. for 2 hours to make a cured product with a film thickness of 1.0 mm. Then dielectric constant (Dk), dielectric loss (Df), glass transition temperature, elastic modulus, thermal decomposition temperature, strain, maximum stress, toughness and water absorption of the cured product were measured. Please see Table 1 and Table 2 for detailed measurement results.

Comparative Example 5

19.0 g of bisphenol epoxy resin (referred to as "R139", epoxy equivalent=190), 16.6 g of methyltetrahydrophthalic anhydride, and 0.2 g of triphenylphosphorus were mixed uniformly to make an adhesive solution, which was dried at 120° C. for 1 hour, dried at 160° C. for 1 hour, and finally baked at 200° C. for 2 hours to produce a cured product with a film thickness of 1.0 mm. Then dielectric constant (Dk), dielectric loss (Df), glass transition temperature, elastic modulus, thermal decomposition temperature, strain, maximum stress, toughness and water absorption of the cured product were measured. Please see Table 1 and Table 2 for detailed measurement results.

TABLE 1

| Equivalent ratio | TPda | CPda | APda | B36 | R139 | HMPA | Dk (10 GHz) | Df (10 GHz) |
|---|---|---|---|---|---|---|---|---|
| Example 5 | 0.15 | — | — | 1.00 | — | — | 2.31 | 0.0024 |
| Example 6 | 0.30 | — | — | 1.00 | — | — | 2.16 | 0.0022 |
| Example 7 | 0.50 | — | — | 1.00 | — | — | 2.28 | 0.0025 |
| Example 8 | — | 0.15 | — | 1.00 | — | — | 2.40 | 0.0030 |
| Example 9 | — | 0.30 | — | 1.00 | — | — | 2.32 | 0.0034 |
| Example 10 | — | 0.50 | — | 1.00 | — | — | 2.33 | 0.0041 |
| Example 11 | — | — | 0.15 | 1.00 | — | — | 2.26 | 0.0023 |
| Example 12 | — | — | 0.30 | 1.00 | — | — | 2.25 | 0.0021 |
| Example 13 | — | — | 0.50 | 1.00 | — | — | 2.32 | 0.0028 |
| Comparative Example 1 | — | — | — | 1.00 | — | — | 2.46 | 0.0025 |
| Comparative Example 2 | 1.00 | — | — | — | — | — | 2.32 | 0.0031 |
| Comparative Example 3 | — | 1.00 | — | — | — | — | 2.36 | 0.0046 |
| Comparative Example 4 | — | — | 1.00 | — | — | — | 2.35 | 0.0032 |
| Comparative Example 5 | — | — | — | — | 1.00 | 1.00 | 2.64 | 0.0150 |

TABLE 2

| | Tg (° C.) | Td3 (° C.) | Td5 (° C.) | elastic modulus (GPa) | strain (%) | maximum stress (Kgf/mm$^2$) | toughness (Kgf·mm/mm$^3$) | Viscosity (mPa.s) | water absorption (%) |
|---|---|---|---|---|---|---|---|---|---|
| Example 6 | 25 | 349 | 375 | 0.5 | 8.24 | 1.04 | 4.5 | 46100 | 0.24 |
| Example 9 | 20 | 360 | 383 | 0.3 | 34.24 | 0.56 | 15.6 | 530 | 0.29 |
| Example 12 | 57 | 372 | 393 | 0.6 | 14.63 | 1.71 | 42.6 | 1618 | 0.28 |
| Comparative Example 1 | 48 | 390 | 408 | 0.2 | 4.48 | 0.82 | 1.8 | 1560 | 0.32 |
| Comparative Example 2 | 35 | 335 | 354 | 0.3 | 4.99 | 0.59 | 1.5 | 151000 | 0.50 |
| Comparative Example 3 | 26 | 264 | 287 | 0.1 | 13.00 | 0.04 | 0.3 | 1250 | 0.39 |
| Comparative Example 4 | 20 | 332 | 358 | 0.1 | 12.67 | 0.34 | 28.4 | 1881 | 0.46 |

Examples 14 to 16

According to Table 3, Examples 14 to 16 were conducted based on the following weight ratios of the uniform adhesive solution of B36-TPda (i.e., TPda of Example 6: B36=0.30: 1.0 (equivalent ratio)) to p-xylyl bis-diphenyl phosphine oxide (abbreviated as "BPO", as a flame retardant, manufactured by Jinyi Chemical Co., Ltd., with a purity of 99.8%).

B36-TPda:DPB=100:20 (Example 14)
B36-TPda:DPB=100:30 (Example 15)
B36-TPda:DPB=100:50 (Example 16)

After Examples 14 to 16 were mixed uniformly, an adhesive solution was produced, which was dried at 170° C. for 2 hours, dried at 200° C. for 2 hours, and finally baked at 220° C. for 2 hours to form a cured product with a film thickness of 1.0 mm. Then dielectric constant (Dk), dielectric loss (Df), glass transition temperature, elastic modulus, thermal decomposition temperature, coefficient of thermal expansion (CTE), and flame retardancy (UL-94) of the cured product were measured. Please see Table 3 for detailed measurement results.

Examples 17 to 19

According to Table 3, Examples 17-19 were conducted based on the following weight ratios of uniform adhesive solution of B36-CPda (i.e., the CPda of Example 9: B36=0.30:1.0 (equivalent ratio)) to BPO flame retardant.
B36-CPda:DPB=100:20 (Example 17)
B36-CPda:DPB=100:30 (Example 18)
B36-CPda:DPB=100:50 (Example 19)

After the above examples are mixed uniformly, an adhesive solution was produced, and dried at 120° C. for 1 hour, dried at 150° C. for 1 hour, dried at 180° C. for 1 hour, and finally baked at 220° C. for 1 hour to form a cured product with a film thickness of 1.0 mm. Then dielectric constant (Dk), dielectric loss (Df), glass transition temperature, elastic modulus, thermal decomposition temperature, coefficient of thermal expansion (CTE), and flame retardancy (UL-94) of the cured product were measured. Please see Table 3 for detailed measurement results.

Examples 20 to 22

According to Table 3, Examples 20 to 22 were conducted based on the following weight ratios of uniform adhesive solution of B36-APda (i.e., the APda of Example 12: B36=0.30:1.0 (equivalent ratio)) to BPO flame retardant.
B36-APda:DPB=100:20 (Example 20)
B36-APda:DPB=100:30 (Example 21)
B36-APda:DPB=100:50 (Example 22)

After the above examples are mixed uniformly, an adhesive solution was produced, and dried at 170° C. for 2 hours, dried at 200° C. for 2 hours, and finally baked at 220° C. for 2 hours to form a cured product with a film thickness of 1.0 mm. Then dielectric constant (Dk), dielectric loss (Df), glass transition temperature, elastic modulus, thermal decomposition temperature, coefficient of thermal expansion (CTE), and flame retardancy (UL-94) of the cured product were measured. Please see Table 3 for detailed measurement results.

Assessment Method:

Glass transition temperature (Tg): The maximum peak temperature is measured with a dynamic mechanical analyzer DMA-Q800 manufactured by TA Instruments. The unit for measurement of the glass transition temperature is ° C.

Elasticity modulus (storage modulus): The unit of measurement for storage modulus measured with DMA-Q800 manufactured by TA Company is GPa.

Thermal decomposition temperature (Td3/Td5): The thermal decomposition temperature at which the thermal weight loss measured by the TGA (Q500) manufactured by TA Company is 3% and 5%, the unit of measurement for which is ° C.

Coefficient of Thermal Expansion (CTE): The Coefficient of Thermal Expansion (CTE) at a temperature of 50 to 300° C. was inspected through TMA (Q400) thermomechanical analysis (TMA) manufactured by TA Company. A test piece of 5 mm (or less than 5 mm)×5 mm (or less than 5 mm)×10 mm was measured at a heating rate of 5° C./min and a nitrogen flow rate of 20 ml/min with a weight of 5.0 g.

Dielectric constant (Dk) and dielectric loss (Df): A network analyzer (E5071C, KEYSIGHT) made by Agilent was adopted to measure with a resonant cavity method at a frequency of 10 GHz.

Water absorption: According to IPC-TM-650 2.6.2.1 method, a 50.8 mm×50.8 mm test piece was dried at 120° C. for one hour and immersed in distilled water at 23° C. for 24 hours to wipe off the water on its surface, and the increased weight of test piece was measured and expressed as a percentage.

Maximum stress, strain, toughness: a tensile tester (PRO, PT-1699V) was adopted for measurement. Measurement was conducted under the conditions of ASTM D638 test method, 23° C. and TYPE IV specimen. The unit of measurement for Max.stress is (Kgf/mm2), the unit of measurement for strain is (%), and the unit of measurement for area of toughness that is defined under the stress-strain curve is (Kgf-mm/mm3).

High-pressure liquid chromatography (HPLC) analysis: The conditions are set as C-18 reverse phase chromatography column, acetonitrile/$H_2O$=8/2 and a flow rate of 1.0 ml/min to measure the purity.

TABLE 3

| weight ratio | | Tg (° C.) | Td3 (° C.) | Td5 (° C.) | Dk (10 GHz) | Df (10 GHz) | elastic modulus (GPa) | CTE (ppm/K) | UL-94 |
|---|---|---|---|---|---|---|---|---|---|
| B36-TPda:BPO | | | | | | | | | |
| Example 6 | 100:0 | 23 | 349 | 375 | 2.20 | 0.0022 | 0.5 | 333 | NG |
| Example 14 | 100:20 | 23 | 352 | 378 | 2.23 | 0.0019 | 0.32 | 260 | V-1 |
| Example 15 | 100:30 | 23 | 354 | 379 | 2.36 | 0.0016 | 0.25 | 236 | V-0 |
| Example 16 | 100:50 | 25 | 355 | 380 | 2.41 | 0.0014 | 0.25 | 194 | V-0 |
| B36-CPda:BPO | | | | | | | | | |
| Example 9 | 100:0 | 23 | 360 | 383 | 2.30 | 0.0034 | 0.20 | 331 | NG |
| Example 17 | 100:20 | 23 | 360 | 383 | 2.32 | 0.0023 | 0.23 | 310 | V-1 |
| Example 18 | 100:30 | 23 | 361 | 385 | 2.36 | 0.0021 | 0.27 | 236 | V-0 |
| Example 19 | 100:50 | 25 | 363 | 386 | 2.38 | 0.0017 | 0.32 | 203 | V-0 |
| B36-APda:BPO | | | | | | | | | |
| Example 12 | 100:0 | 57 | 372 | 393 | 2.25 | 0.0021 | 0.60 | 267 | NG |
| Example 20 | 100:20 | 57 | 371 | 390 | 2.27 | 0.0023 | 0.58 | 242 | V-1 |
| Example 21 | 100:30 | 58 | 368 | 382 | 2.31 | 0.0019 | 0.55 | 217 | V-0 |
| Example 22 | 100:50 | 59 | 364 | 379 | 2.35 | 0.0015 | 0.52 | 185 | V-0 |

Viscosity: BM2 rotary viscometer (30 rpm, 40° C.) manufactured by TOKIMEC was adopted for measuring viscosity.

Flame Retardancy (UL-94): According to UL-94 standard, the flame retardancy was measured by the vertical burning method. The size of the test piece is 125 mm in length, 13 mm in width and 1.5 mm in thickness. In Table 3, "NG" means that the burning time of the vertically arranged sample exceeds 30 seconds; "V-1" means that the vertically arranged sample stops burning within 30 seconds and allow dripping of non-combustible particles; "V0" means that the vertically arranged sample stops burning within 10 seconds and allow dripping of non-combustible particles.

As can be seen from Table 1, in terms of dielectric constant (Dk), the dielectric constant of the benzoxazine (TPda/CPda/APda)-modified bismaleimide (B36) of Examples 5 to 13 is lower than that of the bismaleimide (B36) of Comparative Example 1. In terms of dielectric loss (Df), the dielectric loss of the benzoxazine (TPda/CPda/APda)-modified bismaleimide (B36) of Examples 5 to 13 is lower than that of the benzoxazine (TPda/CPda/APda) of Comparative Examples 2 to 4. In Examples 5 to 13, when benzoxazine:B36=0.3:1 (equivalent ratio), Dk and Df are of the lowest values. In comprehensive assessment of the low dielectric properties, the benzoxazine-modified bismaleimide of Examples 5 to 13 is better than the conventional epoxy-anhydride type liquid packaging resin of Comparative Example 5.

It can be seen from Table 2 that in terms of thermal decomposition temperature (Td3/Td5), the thermal decomposition temperature of the benzoxazine-modified bismaleimide cured products of Examples 6, 9, and 12 are respectively higher than those of the cured products of benzoxazine in Comparative Examples 2, 3, and 4 respectively. In the field of liquid packaging materials, using low-elasticity resin as the adhesive between the chip and the substrate can relieve the stress caused by the mismatch of the thermal expansion coefficient of the chip and the substrate, and improve the reliability of adhesion. Moreover, the storage modulus of the cured product derived from benzoxazine-modified bismaleimide of Examples 6, 9, and 12 is maintained between 0.3 and 0.6 GPa, which is below 1.0 GPa as required for the liquid packaging material. In terms of toughness, the toughness of the cured product derived from the benzoxazine-modified bismaleimide of Examples 6, 9, and 12 are significantly higher than that of the cured product derived from the bismaleimide of Comparative Example 1 and the cured product derived from the benzoxazine of Comparative Examples 2, 3, and 4. In terms of water absorption, the water absorption of the cured product of the benzoxazine-modified bismaleimide of Examples 6, 9, and 12 is lower than that of the cured product derived from the bismaleimide of Comparative Example 1 and the cured product derived from the benzoxazine of Comparative Examples 2, 3, and 4.

It can be seen from Table 3 that tests were carried out on the benzoxazine-modified bismaleimide of Examples 6, 9, and 12 after different proportions of BPO flame retardant were added thereto. It is confirmed that the effect of UL-94 V-0 can be achieved when the amount of added BPO flame retardant is 30 phr or more. As the amount of added BPO flame retardant increases, the thermal decomposition temperature (Td3/Td5) will increase, the dielectric loss (Df) will decrease, the coefficient of thermal expansion (CTE) will reduce, and the storage modulus can also be maintained below 0.58 GPa.

The disclosure endows the benzoxazine-modified bismaleimide resin with high toughness and low dielectric properties by modifying the B36 resin with TPda/CPda/APda resin. Moreover, the disclosure reduces the number of polar groups in the molecular structure, and adds the environmentally friendly phosphorus-based flame retardant with low dielectric constant and dielectric loss to the mix system in which the equivalent ratio of B36 (which adopts biomass C36DA as raw material) to benzoxazine is 1:0.3. The composition of the disclosure is suitable for being used as packaging material for high-frequency communication field, thereby achieving halogen-free, flame-retardant, and low-dielectric characteristics.

The disclosure discloses a thermosetting resin composition. The composition and a flame-retardant resin composition can be applied to semiconductor liquid packaging materials in the high-speed and high-frequency communication fields, interlayer insulating films, and the like.

The disclosure has been described with reference to the above specific embodiments and comparative examples. Those with ordinary knowledge in the technical field to which the present disclosure belongs can make various changes based on the above description, which does not limit the scope of the present disclosure.

What is claimed is:
1. A thermosetting resin composition, the composition at least containing:
(a) a benzoxazine resin, comprising:
at least one selected from a group consisting of

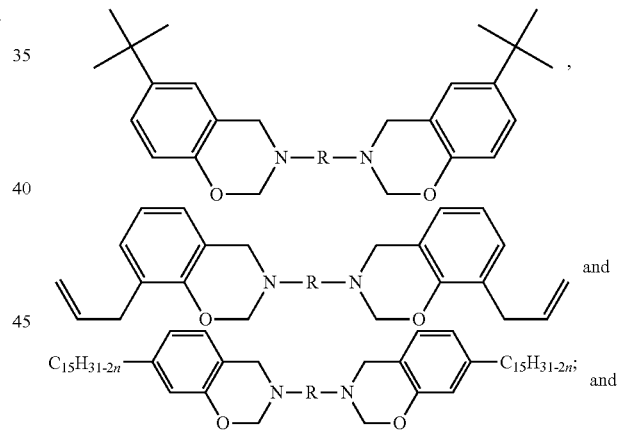

(b) bismaleimide, having a chemical structure as shown in formula (1):

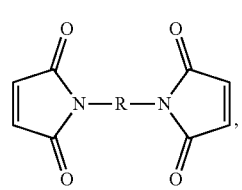

formula (1)

wherein R is a divalent hydrocarbon group with an aliphatic side chain, and has 36 carbon atoms; n is an integer selected from 0 to 3; a ratio of the benzoxazine resin:the bismaleimide=0.1 to 0.5:1.0.

2. A liquid packaging material, which contains the thermosetting resin composition as claimed in claim 1 as its constituent elements.

3. A semiconductor package, comprising the liquid packaging material as claimed in claim 2.

4. A film, which contains the thermosetting resin composition as claimed in claim 1 as its constituent elements.

5. An interlayer insulating film, comprising the film as claimed in claim 4.

6. A semiconductor package, comprising the film as claimed in claim 4.

7. A flame-retardant resin composition, at least containing:

(a) a benzoxazine resin, comprising:

at least one selected from a group consisting of

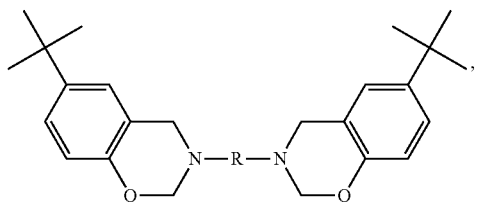
,

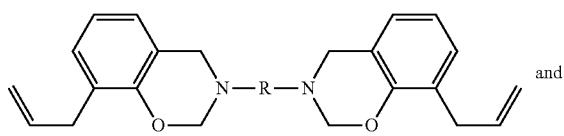
and

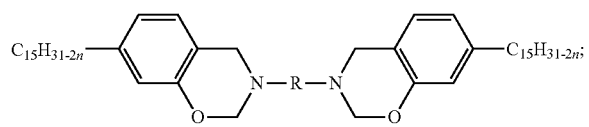
;

(b) bismaleimide, having a chemical structure as shown in formula (1):

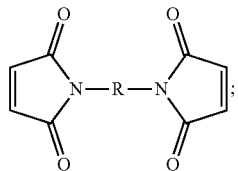

formula (1)

and (c) a flame retardant, having a chemical structure as shown in formula (2):

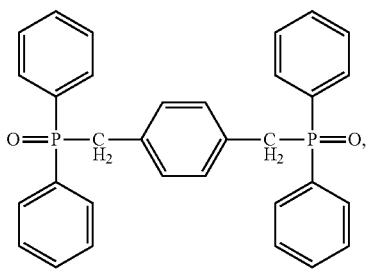

formula (2)

wherein R is a divalent hydrocarbon group with an aliphatic side chain, and has 36 carbon atoms; n is an integer selected from 0 to 3; a ratio of the benzoxazine resin:the bismaleimide=0.1 to 0.5:1.0.

8. A liquid packaging material, which contains the flame-retardant resin composition as claimed in claim 7 as its constituent elements.

9. A semiconductor package, comprising the liquid packaging material as claimed in claim 8.

10. A film, which contains the flame-retardant resin composition as claimed in claim 7 as its constituent elements.

11. An interlayer insulating film, comprising the film as claimed in claim 10.

12. A semiconductor package, comprising the film as claimed in claim 10.

\* \* \* \* \*